United States Patent
Miftakhov et al.

(10) Patent No.: US 10,850,629 B2
(45) Date of Patent: *Dec. 1, 2020

(54) SYSTEMS AND METHODS FOR INTEGRATION OF ELECTRIC VEHICLE CHARGING STATIONS WITH PHOTOVOLTAIC, WIND, HYDRO, THERMAL AND OTHER ALTERNATIVE ENERGY GENERATION EQUIPMENT

(71) Applicant: Enel X North America, Inc., Boston, MA (US)

(72) Inventors: Valery Miftakhov, San Carlos, CA (US); Alexander Gurzhi, San Jose, CA (US); Alan White, Tiburon, CA (US)

(73) Assignee: Enel X North America, Inc., Boston, MA (US)

( * ) Notice: Subject to any disclaimer, the term of this patent is extended or adjusted under 35 U.S.C. 154(b) by 161 days.

This patent is subject to a terminal disclaimer.

(21) Appl. No.: 15/690,272

(22) Filed: Aug. 29, 2017

(65) Prior Publication Data

US 2017/0361727 A1 Dec. 21, 2017

Related U.S. Application Data

(63) Continuation-in-part of application No. 15/004,974, filed on Jan. 24, 2016, now Pat. No. 10,399,450,
(Continued)

(51) Int. Cl.
*H02J 7/00* (2006.01)
*B60L 53/14* (2019.01)
(Continued)

(52) U.S. Cl.
CPC .......... *B60L 53/14* (2019.02); *B60L 11/1844* (2013.01); *B60L 53/305* (2019.02); *B60L 53/63* (2019.02);
(Continued)

(58) Field of Classification Search
CPC .. H02J 50/12; H02J 7/025; H02J 5/005; H02J 50/50; H02J 50/70; H02J 50/60;
(Continued)

(56) References Cited

U.S. PATENT DOCUMENTS 9,987,941 B2 * 6/2018 Miftakhov ............ H02J 7/0027
2009/0021213 A1 1/2009 Johnson
(Continued)

OTHER PUBLICATIONS

Miftakhov, Notice of Allowance dated Jun. 27, 2019 for U.S. Appl. No. 15/225,821.
(Continued)

*Primary Examiner* — Binh C Tat
(74) *Attorney, Agent, or Firm* — Stoel Rives LLP

(57) ABSTRACT

In accordance with one aspect of the embodiments described herein, there are provided systems and methods for integration of electric vehicle charging stations with photovoltaic, wind, hydro, thermal and other alternative energy generation equipment. In various embodiments, the aforesaid integration is used to perform balancing of the electrical power generated by the aforesaid photovoltaic, wind, hydro, thermal and other alternative energy generation equipment and the electrical power consumed by the aforesaid EVSE equipment. In one exemplary embodiment, the aforesaid balancing may be performed on a house (building) level. In another exemplary embodiment, the balancing may be performed on a neighborhood level.

20 Claims, 2 Drawing Sheets

Related U.S. Application Data which is a continuation-in-part of application No. 14/853,955, filed on Sep. 15, 2015, now Pat. No. 9,987,941.

(60) Provisional application No. 62/050,147, filed on Sep. 14, 2014.

(51) Int. Cl.
| | | |
|---|---|---|
| *B60L 11/18* | (2006.01) | |
| *H02J 3/14* | (2006.01) | |
| *H02J 3/38* | (2006.01) | |
| *G01R 31/3842* | (2019.01) | |
| *B60L 53/68* | (2019.01) | |
| *B60L 53/30* | (2019.01) | |
| *B60L 53/63* | (2019.01) | |
| *B60L 53/66* | (2019.01) | |

(52) U.S. Cl.
CPC ............ *B60L 53/665* (2019.02); *B60L 53/68* (2019.02); *G01R 31/3842* (2019.01); *H02J 3/14* (2013.01); *H02J 3/383* (2013.01); *H02J 7/0027* (2013.01); *B60L 2240/70* (2013.01); *B60L 2250/20* (2013.01); *Y02B 10/14* (2013.01); *Y02E 60/721* (2013.01); *Y02T 10/7005* (2013.01); *Y02T 10/7094* (2013.01); *Y02T 10/7291* (2013.01); *Y02T 90/121* (2013.01); *Y02T 90/128* (2013.01); *Y02T 90/14* (2013.01); *Y02T 90/16* (2013.01); *Y02T 90/163* (2013.01); *Y02T 90/168* (2013.01); *Y02T 90/169* (2013.01); *Y04S 10/126* (2013.01); *Y04S 30/12* (2013.01); *Y04S 30/14* (2013.01)

(58) Field of Classification Search
CPC .......... H02J 50/90; H02J 50/80; H02J 7/0029; H02J 7/0047; H02J 7/35; H02J 50/40; H02J 7/00034; H02J 50/20; H02J 7/34; H02J 13/00034; H02J 13/00028; H02J 13/0006; H02J 3/00; H02J 3/383; H02J 13/00016; H02J 13/0062; H02J 13/0079; H02J 13/00006; H02J 7/0068; H02J 50/30; H02J 2300/28; H02J 3/32; H02J 3/322; H02J 50/10; H02J 50/15; H02J 7/00045; H02J 9/02; H02J 9/065; H02J 13/00; H02J 13/00017; H02J 13/0013; H02J 13/0017; H02J 2310/40; H02J 2310/48; H02J 3/24; H02J 7/00304; H02J 7/045; H02J 7/345; H02J 9/061; H02J 3/008; H02J 3/381; H02J 13/00001; H02J 13/00004; H02J 13/0086; H02J 15/00; H02J 2203/20; H02J 2300/10; H02J 2300/24; H02J 2310/12; H02J 3/003; H02J 3/14; H02J 3/38; H02J 50/05; H02J 50/23; H03H 7/40; B60L 53/126; B60L 2210/30; B60L 2210/40; B60L 2210/10; B60L 2210/20; B60L 2260/28; B60L 53/11; B60L 53/16; H01F 5/003; Y02T 10/7005; Y02T 90/122; Y02T 90/128; Y02T 10/7088; Y02T 90/127; Y02T 10/7072; Y02T 90/12; Y04S 10/126; Y04S 50/12; H04B 5/0037; H04B 5/0081

USPC .................................................. 320/104–115
See application file for complete search history.

(56) References Cited

U.S. PATENT DOCUMENTS

| | | | |
|---|---|---|---|
| 2010/0013436 | A1 | 1/2010 | Lowenthal et al. |
| 2010/0201309 | A1 | 8/2010 | Meek |
| 2010/0217550 | A1 | 8/2010 | Crabtree et al. |
| 2011/0025267 | A1* | 2/2011 | Kamen .................... B60L 55/00 320/109 |
| 2011/0084553 | A1 | 4/2011 | Adest et al. |
| 2011/0106329 | A1 | 5/2011 | Donnelly et al. |
| 2011/0202192 | A1 | 8/2011 | Kempton |
| 2011/0202418 | A1* | 8/2011 | Kempton .............. B60L 53/665 705/26.1 |
| 2012/0133337 | A1 | 5/2012 | Rombouts et al. |
| 2013/0127416 | A1* | 5/2013 | Karner ................... B60L 50/40 320/109 |
| 2013/0127417 | A1 | 5/2013 | Karner et al. |
| 2013/0169226 | A1 | 7/2013 | Read |
| 2013/0179061 | A1 | 7/2013 | Gadh et al. |
| 2013/0241485 | A1 | 9/2013 | Snyder |
| 2013/0264865 | A1 | 10/2013 | Sugeno et al. |
| 2014/0062401 | A1 | 3/2014 | Gadh et al. |
| 2014/0125279 | A1 | 5/2014 | Juhasz |
| 2015/0091506 | A1 | 4/2015 | Hyde et al. |
| 2016/0236584 | A1 | 8/2016 | Miftakhov et al. |
| 2016/0236585 | A1 | 8/2016 | Miftakhov et al. |
| 2016/0257214 | A1 | 9/2016 | Miftakhov et al. |
| 2016/0339788 | A1 | 11/2016 | Miftakhov |
| 2017/0017213 | A1 | 1/2017 | Miftakhov et al. |
| 2018/0015838 | A1 | 1/2018 | Miftakhov et al. |

OTHER PUBLICATIONS

Miftakhov , Office Action dated Jul. 27, 2018 for U.S. Appl. No. 15/225,821.
Miftakhov , Office Action dated Oct. 23, 2017 for U.S. Appl. No. 15/225,821.
Miftakhov , et al., Notice of Allowance dated Apr. 18, 2019 for U.S. Appl. No. 15/004,974.
Miftakhov , et al., Notice of Allowance dated Feb. 9, 2018 for U.S. Appl. No. 14/853,955.
Miftakhov , et al., Notice of Allowance dated Mar. 26, 2018 for U.S. Appl. No. 15/004,976.
Miftakhov , et al., Notice of Allowance dated May 21, 2019 for U.S. Appl. No. 15/004,980.
Miftakhov , et al., Office Action dated Apr. 19, 2018 for U.S. Appl. No. 15/004,974.
Miftakhov , et al., Office Action dated Apr. 20, 2017 for U.S. Appl. No. 14/853,955.
Miftakhov , et al., Office Action dated Aug. 10, 2017 for U.S. Appl. No. 15/004,980.
Miftakhov , et al., Office Action dated Jul. 13, 2017 for U.S. Appl. No. 15/004,974.
Miftakhov , et al., Office Action dated Jul. 14, 2017 for U.S. Appl. No. 15/004,976.
Miftakhov , et al., Office Action dated Jun. 28, 2019 for U.S. Appl. No. 15/690,275.
Miftakhov , et al., Office action dated Mar. 5, 2020 for U.S. Appl. No. 15/690,275.
Miftakhov , et al., Office Action dated May 18, 2018 for U.S. Appl. No. 15/004,980.

* cited by examiner

SYSTEMS AND METHODS FOR INTEGRATION OF ELECTRIC VEHICLE CHARGING STATIONS WITH PHOTOVOLTAIC, WIND, HYDRO, THERMAL AND OTHER ALTERNATIVE ENERGY GENERATION EQUIPMENT

CROSS-REFERENCE TO RELATED PATENT APPLICATION

This regular U.S. patent application relies upon, claims the benefit of priority from and is a continuation-in-part of U.S. patent application Ser. No. 15/004,974 filed on Jan. 24, 2016, which is a continuation-in-part of U.S. patent application Ser. No. 14/853,955 filed on Sep. 14, 2015, which relies upon and claims the benefit of priority from U.S. provisional patent application No. 62/050,147, entitled "Grid Stabilization via a Large Distributed Collection of EV Charging Stations," filed on Sep. 14, 2014, all of which are incorporated by reference herein in their entirety.

BACKGROUND OF THE INVENTION

Field of the Invention

The disclosed embodiments relate in general to the field of photovoltaic, wing, hydro, thermal and other alternative energy generation and electric vehicle charging technology, and, more specifically, to systems and methods for integration of electric vehicle charging stations with photovoltaic, wind, hydro, thermal and other alternative energy generation equipment.

Description of the Related Art

Wide adoption of electric vehicles by general population requires availability of substantial electrical power capacities for purposes of electric vehicle charging. Depending on the electric vehicle and the charger used, each vehicle may require 40-200 amperes of charging electric current. As would be appreciated by persons of ordinary skill in the art, simultaneous charging of a large number of electric vehicles by residents of a neighborhood may place substantial strain on the existing local power grid, which may not have been designed to accommodate such simultaneous high power loads. With the development of new electric energy storage technologies, such as graphene supercapacitors, which may be charged to full capacity in a substantially shorter times compared to conventional lithium batteries, used in most electric vehicles, this problem of handling high simultaneous charging loads will be exacerbated. In addition to electric vehicles, many houses of the future will incorporate energy storage systems, such as Tesla Powerwall battery, which may also be charged from electric grid. Charging of such energy storage systems may also put additional strain on the existing grid infrastructure.

On the other hand, currently, electric vehicle supply equipment (EVSE, a.k.a. EV charging stations) does not have the appropriate functionality to be integrated with photovoltaic, wing, hydro, thermal and other alternative energy generation installations that homeowners and businesses may have. Accordingly, it would be desirable to have the electric vehicle supply equipment as well as other power loads that would have the ability to integrate with the photovoltaic, wing, hydro, thermal and other alternative energy generation installations to reduce excess load on the existing fixed power grid infrastructure, increase the efficiency of charging and reduce the environmental footprint.

SUMMARY OF THE INVENTION

The inventive methodology is directed to methods and systems that substantially obviate one or more of the above and other problems associated with conventional systems and methods for electrical vehicle charging and alternative electrical power generation.

In accordance with one aspect of the embodiments described herein, there is provided a system for charging an electric or hybrid-electric vehicle, the system comprising: at least one vehicle charging station electrically connectable to the vehicle and operable to charge the vehicle using an electrical power; at least one source of alternative electrical energy providing an alternative electrical power; and a control server comprising at least one processing unit and a memory and communicatively coupled to the at least one vehicle charging station and the at least one source of alternative electrical energy via a data network, the control server receiving a reading from the source of alternative electrical energy via the data network, wherein the control server controls the vehicle charging station by issuing a charge control command via the data network to charge the vehicle such as to achieve balancing of the electrical power drawn by the vehicle charging station against the alternative electrical power generated by the source of alternative electrical energy.

In one or more embodiments, the source of alternative electrical energy comprises a photovoltaic panel electrically connected to a photovoltaic inverter and wherein the control server is communicatively coupled to the photovoltaic inverter.

In one or more embodiments, the reading comprises an amount of sunlight received by the photovoltaic panel.

In one or more embodiments, the reading comprises an amount of electrical current generated by the photovoltaic panel.

In one or more embodiments, the reading comprises an amount of electrical power generated by the photovoltaic panel.

In one or more embodiments, the source of alternative electrical energy comprises a wind turbine.

In one or more embodiments, the source of alternative electrical energy comprises a geothermal installation.

In one or more embodiments, the balancing is achieved when the electrical power drawn by the vehicle charging station is substantially equal to the alternative electrical power generated by the source of alternative electrical energy.

In one or more embodiments, the balancing is achieved when an excess of the electrical power drawn by the vehicle charging station over the alternative electrical power generated by the source of alternative electrical energy is less than a predetermined threshold.

In one or more embodiments, the predetermined threshold is set by a user using a user interface.

In one or more embodiments, the balancing is achieved when a cost of an excess of the electrical power drawn by the vehicle charging station over the alternative electrical power generated by the source of alternative electrical energy is less than a predetermined threshold.

In one or more embodiments, the balancing is achieved when a carbon footprint of an excess of the electrical power drawn by the vehicle charging station over the alternative electrical power generated by the source of alternative electrical energy is less than a predetermined threshold.

In one or more embodiments, the control server further receives a plurality of readings from a plurality of sources of alternative electrical energy in a neighborhood via the data network, wherein the control server controls a plurality of vehicle charging stations by issuing a plurality charge control commands via the data network to charge a plurality of vehicles such as to achieve balancing of the electrical power drawn by the plurality of vehicle charging stations against the alternative electrical power generated by the plurality of sources of alternative electrical energy.

In one or more embodiments, owners of the sources of alternative electrical energy associated with excess energy production are compensated using a cryptocurrency.

In accordance with another aspect of the embodiments described herein, there is provided a computer-implemented method for charging an electric or hybrid-electric vehicle, the method being performed in connection with a system comprising: at least one vehicle charging station electrically connectable to the vehicle and operable to charge the vehicle using an electrical power; at least one source of alternative electrical energy providing an alternative electrical power; and a control server comprising at least one processing unit and a memory and communicatively coupled to the at least one vehicle charging station and the at least one source of alternative electrical energy via a data network, the method comprising: receiving, by the control server, a reading from the source of alternative electrical energy via the data network; and controlling, by the control server, the vehicle charging station by issuing a charge control command via the data network to charge the vehicle such as to achieve balancing of the electrical power drawn by the vehicle charging station against the alternative electrical power generated by the source of alternative electrical energy.

In accordance with yet another aspect of the embodiments described herein, there is provided a non-transitory computer-readable medium embodying a set of instructions, which, when executed in connection with a system comprising: at least one vehicle charging station electrically connectable to the vehicle and operable to charge the vehicle using an electrical power; at least one source of alternative electrical energy providing an alternative electrical power; and a control server comprising at least one processing unit and a memory and communicatively coupled to the at least one vehicle charging station and the at least one source of alternative electrical energy via a data network, cause the system to perform a method comprising: receiving, by the control server, a reading from the source of alternative electrical energy via the data network; and controlling, by the control server, the vehicle charging station by issuing a charge control command via the data network to charge the vehicle such as to achieve balancing of the electrical power drawn by the vehicle charging station against the alternative electrical power generated by the source of alternative electrical energy.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

In accordance with one aspect of the embodiments described herein, there are provided systems and methods for integration of electric vehicle charging stations with photovoltaic, wind, hydro, thermal and other alternative energy generation equipment. In various embodiments, the aforesaid integration is used to perform balancing of the electrical power generated by the aforesaid photovoltaic, wind, hydro, thermal and other alternative energy generation equipment and the electrical power consumed by the aforesaid EVSE equipment. In one exemplary embodiment, the aforesaid balancing may be performed on a house (building) level. In another exemplary embodiment, the balancing may be performed on a neighborhood level.

Figure 1:
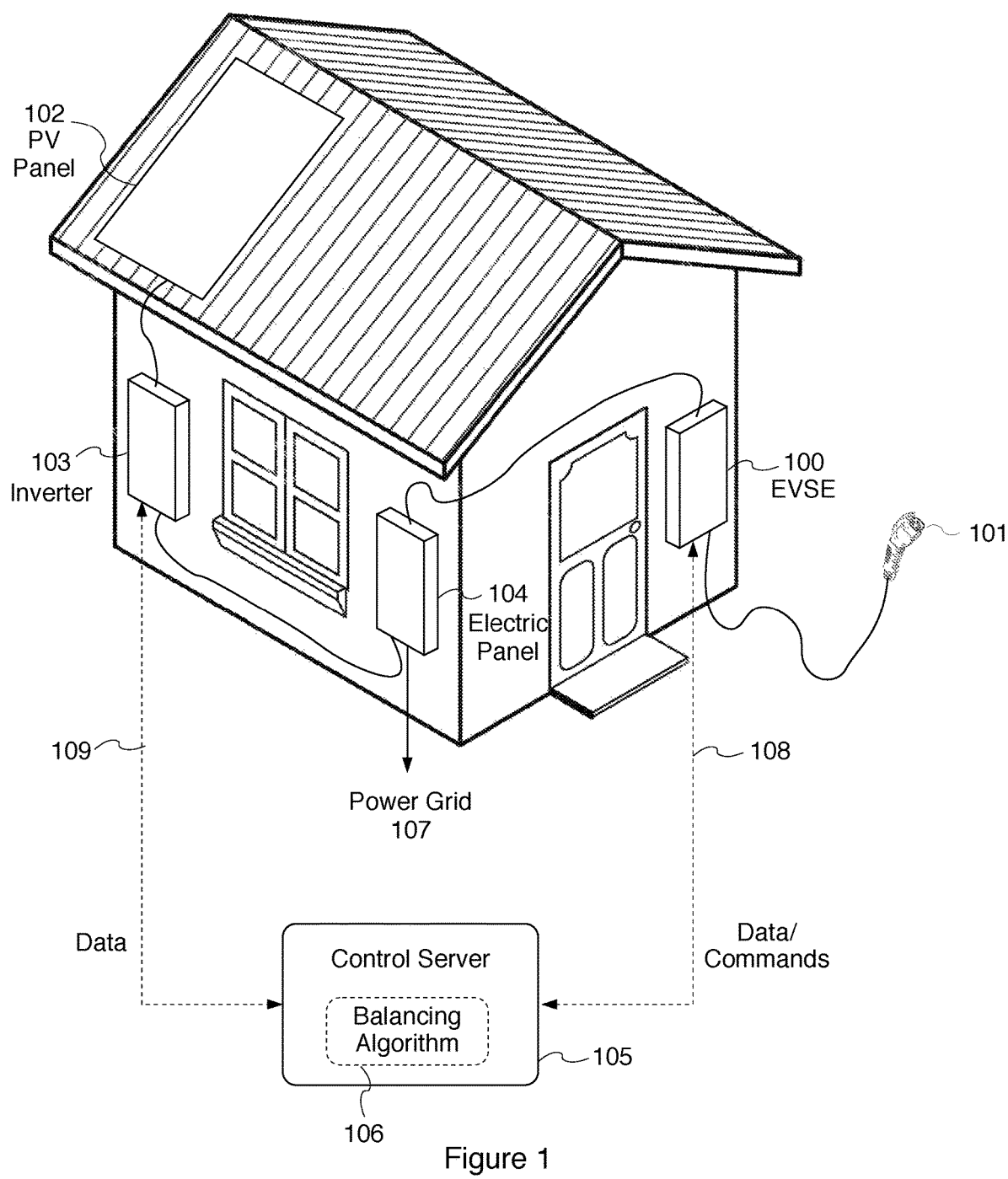
FIG. 1 illustrates an exemplary embodiment of a system for integrating integration of electric vehicle charging stations with photovoltaic, wind, hydro, thermal and other alternative energy generation equipment.

FIG. 1 illustrates an exemplary embodiment of a system for integrating integration of electric vehicle charging stations with photovoltaic, wind, hydro, thermal and other alternative energy generation equipment. In the embodiment shown in FIG. 1, electric or hybrid vehicle (EV/PHEV, not shown) is connected to and being charged by electric vehicle supply equipment (EVSE) 100 through a vehicle charge plug 101. The EVSE 100 is electrically connected to a service electric panel 104 of the building and draws electrical power therefrom during the electric vehicle charging. The EVSE 100 is additionally connected, via a data network 107, to a control server (105) and sends telemetry to, and receives charging control commands from this control server (105). It should be noted that in the system shown in FIG. 1, the EVSE 100 does not offer a separate user interface (UI).

In the embodiment shown in FIG. 1, a photovoltaic system is installed in connection with the shown building. The aforesaid photovoltaic system incorporates one or more photovoltaic panels 102, suitably disposed on a roof of the building to maximize its exposure to direct sunlight, and electrically connected to an inverter panel 103. The inverter panel 103 is, in turn, is electrically coupled to the building's electrical service panel 104. In addition to the aforesaid electrical connections, the inverter panel 103 is additionally connected, via data network 108, to the aforesaid control server 105 and sends telemetry thereto. In various embodiments, the sent telemetry may include the generated photovoltaic voltage/current/power reading, the sunlight intensity reading and the like. Finally, the building's electrical service panel 104 is electrically connected to power grid 107.

In one or more embodiments, the control server 105 executes a power balancing algorithm 106 configured to balance the power output of the photovoltaic system 102/103 and the power draw of the EVSE 100. In various embodiments, the aforesaid power balancing algorithm 106 may control the EVSE 100 in accordance with various modes of operation. In various embodiments, the aforesaid power balancing could be implemented on a building level or neighborhood level. In various embodiments, the aforesaid modes of operation are user-selectable by means of a user interface that may be generated by the control server 105 or any other suitable component of the system. In one embodiment, such user interface may be generated on user's mobile device (not shown).

In accordance with a first exemplary operating mode, the control server 105 controls the rate of charge delivered to the electric vehicle by the EVSE 100 in accordance with the amount of sunlight received by the photovoltaic panel(s) 102 and reported to the control server 105 by the inverter 103 via the data network 108. In one embodiment, the control server 105 controls the rate of charge delivered to the electric vehicle by the EVSE 100 such that the vehicle charging power is substantially equal to the aforesaid generated photovoltaic power and the net external grid power draw of the entire system shown in FIG. 1 is substantially equal to zero.

In accordance with a second exemplary operating mode, the control server 105 controls the rate of charge delivered to the electric vehicle by the EVSE 100 such that the vehicle charging power exceeds the aforesaid generated photovoltaic power by an amount that is less than a predetermined threshold set by the user.

In accordance with a third exemplary operating mode, the control server 105 controls the rate of charge delivered to the electric vehicle by the EVSE 100 in accordance with the amount of sunlight received by the photovoltaic panel(s) 102 and reported to the control server 105 by the inverter 103 via the data network 108 as well as the cost of electric power at a specific time of the day. In one embodiment, the control server 105 controls the rate of charge delivered to the electric vehicle by the EVSE 100 such that the vehicle charging cost does not exceed a predetermined threshold set by the user.

In accordance with a fourth exemplary operating mode, the control server 105 controls the rate of charge delivered to the electric vehicle by the EVSE 100 in accordance with the amount of sunlight received by the photovoltaic panel(s) 102 and reported to the control server 105 by the inverter 103 via the data network 108 as well as the carbon footprint of the source of the grid power at a specific time of the day. In one embodiment, the control server 105 controls the rate of charge delivered to the electric vehicle by the EVSE 100 such that the vehicle charging carbon emission footprint is minimized and/or does not exceed a predetermined threshold set by the user.

In one embodiment, the aforesaid vehicle charging carbon emission footprint is calculated based on the amount of power drawn by the system shown in FIG. 1 from the power grid 107 and the percentage of the grid electrical power derived from carbon-emission-producing sources at a specific time of the day. For example, at if at 2 PM 40% of the grid power is generated using fossil fuels, while at 4 PM 50% of the grid power is generated using fossil fuels, the control server would schedule charging of the electric vehicle by the EVSE 100 to minimize the carbon footprint of the charging in accordance with the constraints (e.g. carbon footprint threshold, charging time, miles to be driven, etc.) specified by the user.

In accordance with a fifth exemplary operating mode, the control server 105 controls the rate of charge delivered to the electric vehicle by the EVSE 100 based on the cumulative electric power generation and consumption in the entire neighborhood. In such embodiment, the control server 105 receives multiple data feeds from multiple buildings and appropriately aggregates them. After that, the net grid power draw of the entire neighborhood is calculated as excess electrical charging power over the generated photovoltaic power. The above first, second, third and fourth operating modes are then implemented on the neighborhood scale. It should be noted that multiple households in the neighborhood may receive credits for excess power generation or debits for their power shortages. In one embodiment, such debits or credits are implemented using cryptocurrency, such as Ether or Bitcoin, and smart contracts configured to execute automatically by network, such as Ethereum network. Users with excess power production would automatically receive cryptocurrency credits to their respective wallets based on the power readings reported to the control server 105, while the users who are short of power would have their wallet balances automatically debited.

It should be noted that while in the above description, the inventive concepts were illustrated using photovoltaic power, the inventive techniques described herein may be used in connection with any source of alternative electrical energy, such as wind, hydro, thermal, etc. Therefore, the invention is not limited to any specific electrical power source.

Exemplary Computer Platform

Figure 2:
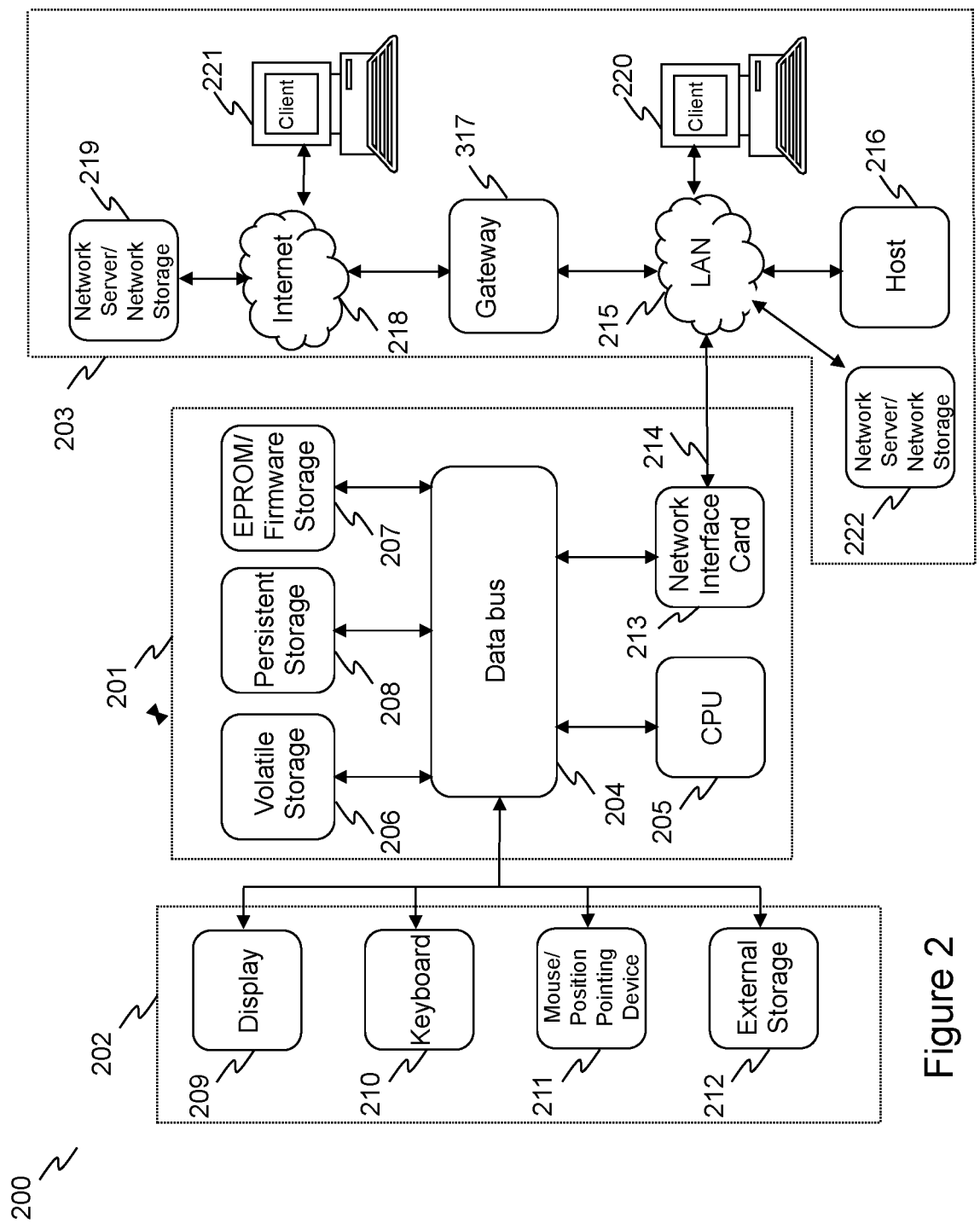
FIG. 2 is a block diagram that illustrates an embodiment of a computer/server system upon which an embodiment of the inventive methodology may be implemented.

FIG. 2 is a block diagram that illustrates an embodiment of a computer/server system 200 upon which an embodiment of the inventive methodology may be implemented. The system 200 includes a computer/server platform 201, peripheral devices 202 and network resources 203. As would be appreciated by persons of ordinary skill in the art, various embodiments described hereinabove may be deployed based on the aforesaid computer/server system 200.

The computer platform 201 may include a data bus 205 or other communication mechanism for communicating information across and among various parts of the computer platform 201, and a processor 205 coupled with bus 201 for processing information and performing other computational and control tasks. Computer platform 201 also includes a volatile storage 206, such as a random access memory (RAM) or other dynamic storage device, coupled to bus 205 for storing various information as well as instructions to be executed by processor 205. The volatile storage 206 also may be used for storing temporary variables or other intermediate information during execution of instructions by processor 205. Computer platform 201 may further include a read only memory (ROM or EPROM) 207 or other static storage device coupled to bus 204 for storing static information and instructions for processor 205, such as basic input-output system (BIOS), as well as various system configuration parameters. A persistent storage device 208, such as a magnetic disk, optical disk, or solid-state flash memory device is provided and coupled to bus 201 for storing information and instructions.

Computer platform 201 may be coupled via bus 205 to a display 209, such as a cathode ray tube (CRT), plasma display, or a liquid crystal display (LCD), for displaying information to a system administrator or user of the computer platform 201. An input device 210, including alphanumeric and other keys, is coupled to bus 201 for communicating information and command selections to processor 205. Another type of user input device is cursor control device 211, such as a mouse, a trackball, or cursor direction keys for communicating direction information and command selections to processor 205 and for controlling cursor movement on display 209. This input device typically has two degrees of freedom in two axes, a first axis (e.g., x) and a second axis (e.g., y), that allows the device to specify positions in a plane.

An external storage device 212 may be coupled to the computer platform 201 via bus 205 to provide an extra or removable storage capacity for the computer platform 201. In an embodiment of the computer system 200, the external removable storage device 212 may be used to facilitate exchange of data with other computer systems.

The invention is related to the use of computer system 200 for implementing the techniques described herein. In an embodiment, the inventive system may reside on a machine such as computer platform 201. According to one embodiment of the invention, the techniques described herein are performed by computer system 200 in response to processor 205 executing one or more sequences of one or more instructions contained in the volatile memory 206. Such instructions may be read into volatile memory 206 from another computer-readable medium, such as persistent storage device 208. Execution of the sequences of instructions contained in the volatile memory 206 causes processor 205 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 205 for execution. The computer-readable medium is just one example of a machine-readable medium, which may carry instructions for implementing any of the methods and/or techniques described herein. Such a medium may take many forms, including but not limited to, non-volatile media and volatile media. Non-volatile media includes, for example, optical or magnetic disks, such as storage device 208. Volatile media includes dynamic memory, such as volatile storage 206.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, an EPROM, a FLASH-EPROM, a flash drive, a memory card, any other memory chip or cartridge, or any other medium from which a computer can read.

Various forms of computer readable media may be involved in carrying one or more sequences of one or more instructions to processor 205 for execution. For example, the instructions may initially be carried on a magnetic disk from a remote computer. Alternatively, a remote computer can load the instructions into its dynamic memory and send the instructions over a telephone line using a modem. A modem local to computer system can receive the data on the telephone line and use an infra-red transmitter to convert the data to an infra-red signal. An infra-red detector can receive the data carried in the infra-red signal and appropriate circuitry can place the data on the data bus 205. The bus 205 carries the data to the volatile storage 206, from which processor 205 retrieves and executes the instructions. The instructions received by the volatile memory 206 may optionally be stored on persistent storage device 208 either before or after execution by processor 205. The instructions may also be downloaded into the computer platform 201 via Internet using a variety of network data communication protocols well known in the art.

The computer platform 201 also includes a communication interface, such as network interface card 213 coupled to the data bus 205. Communication interface 213 provides a two-way data communication coupling to a network link 215 that is coupled to a local network 215. For example, communication interface 213 may be an integrated services digital network (ISDN) card or a modem to provide a data communication connection to a corresponding type of telephone line. As another example, communication interface 213 may be a local area network interface card (LAN NIC) to provide a data communication connection to a compatible LAN. Wireless links, such as well-known 802.11a, 802.11b, 802.11g and Bluetooth may also used for network implementation. In any such implementation, communication interface 213 sends and receives electrical, electromagnetic or optical signals that carry digital data streams representing various types of information.

Network link 215 typically provides data communication through one or more networks to other network resources. For example, network link 215 may provide a connection through local network 215 to a host computer 216, or a network storage/server 217. Additionally or alternatively, the network link 213 may connect through gateway/firewall 217 to the wide-area or global network 218, such as an Internet. Thus, the computer platform 201 can access network resources located anywhere on the Internet 218, such as a remote network storage/server 219. On the other hand, the computer platform 201 may also be accessed by clients located anywhere on the local area network 215 and/or the Internet 218. The network clients 220 and 221 may themselves be implemented based on the computer platform similar to the platform 201.

Local network 215 and the Internet 218 both use electrical, electromagnetic or optical signals that carry digital data streams. The signals through the various networks and the signals on network link 215 and through communication interface 213, which carry the digital data to and from computer platform 201, are exemplary forms of carrier waves transporting the information.

Computer platform 201 can send messages and receive data, including program code, through the variety of network(s) including Internet 218 and LAN 215, network link 215 and communication interface 213. In the Internet example, when the system 201 acts as a network server, it might transmit a requested code or data for an application program running on client(s) 220 and/or 221 through Internet 218, gateway/firewall 217, local area network 215 and communication interface 213. Similarly, it may receive code from other network resources.

The received code may be executed by processor 205 as it is received, and/or stored in persistent or volatile storage devices 208 and 206, respectively, or other non-volatile storage for later execution.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive.

Moreover, other implementations of the invention will be apparent to those skilled in the art from consideration of the specification and practice of the invention disclosed herein. Various aspects and/or components of the described embodiments may be used singly or in any combination in systems and methods for integration of electric vehicle charging stations with photovoltaic, wind, hydro, thermal and other alternative energy generation equipment. It is intended that the specification and examples be considered as exemplary only, with a true scope and spirit of the invention being indicated by the following claims.

What is claimed is:

1. A system for charging an electric or hybrid-electric vehicle, the system comprising:
    at least one vehicle charging station electrically connectable to the vehicle and operable to charge the vehicle using an electrical power;
    at least one source of alternative electrical energy to provide the electrical power as an alternative electrical power, the at least one source of alternative electrical energy being distinct from and an alternative source to a utility power grid, which is to provide the electrical power as a grid electrical power; and
    a control server, comprising at least one processing unit and a memory, and communicatively coupled to the at least one vehicle charging station and the at least one source of alternative electrical energy via a data network, the control server receiving a reading from the at least one source of alternative electrical energy via the data network, wherein the control server controls the at least one vehicle charging station by issuing a charge control command via the data network to charge the vehicle such as to achieve balancing of the electrical power drawn by the at least one vehicle charging station against the alternative electrical power generated by the at least one source of alternative electrical energy, wherein the balancing is achieved by comparing one or more characteristics of the electrical power drawn by the at least one vehicle charging station to the alternative electrical power generated by the at least one source of alternative electrical energy.

2. The system for charging an electric or hybrid-electric vehicle of claim 1, wherein a source of alternative electrical energy of the at least one source of alternative electrical energy comprises a photovoltaic panel electrically connected to a photovoltaic inverter and wherein the control server is communicatively coupled to the photovoltaic inverter.

3. The system for charging an electric or hybrid-electric vehicle of claim 2, wherein the reading comprises an amount of sunlight received by the photovoltaic panel.

4. The system for charging an electric or hybrid-electric vehicle of claim 2, wherein the reading comprises an amount of electrical current generated by the photovoltaic panel.

5. The system for charging an electric or hybrid-electric vehicle of claim 2, wherein the reading comprises an amount of electrical power generated by the photovoltaic panel.

6. The system for charging an electric or hybrid-electric vehicle of claim 1, wherein a source of the alternative electrical energy of the at least one source of alternative electrical energy comprises a wind turbine.

7. The system for charging an electric or hybrid-electric vehicle of claim 1, wherein a source of the alternative electrical energy of the at least one source of alternative electrical energy comprises a geothermal installation.

8. The system for charging an electric or hybrid-electric vehicle of claim 1, wherein the one or more characteristics of the electrical power drawn by the at least one vehicle charging station includes an amount of the electrical power drawn by the at least one vehicle charging station, and the one or more characteristics of the alternative electrical power generated by the at least one source of alternative electrical energy includes an amount of the alternative electrical power generated by the at least one source of alternative electrical energy, and wherein the balancing is achieved when the amount of electrical power drawn by the at least one vehicle charging station is substantially equal to the amount of alternative electrical power generated by the at least one source of alternative electrical energy.

9. The system for charging an electric or hybrid-electric vehicle of claim 1, wherein the one or more characteristics of the electrical power drawn by the at least one vehicle charging station includes an amount of the electrical power drawn by the at least one vehicle charging station, and the one or more characteristics of the alternative electrical power generated by the at least one source of alternative electrical energy includes an amount of the alternative electrical power generated by the at least one source of alternative electrical energy, and wherein the balancing is achieved when an excess of the amount of electrical power drawn by the at least one vehicle charging station over the amount of alternative electrical power generated by the at least one source of alternative electrical energy is less than a predetermined threshold.

10. The system for charging an electric or hybrid-electric vehicle of claim 9, wherein the predetermined threshold is set via a user interface.

11. The system for charging an electric or hybrid-electric vehicle of claim 1, wherein the one or more characteristics of the electrical power drawn by the at least one vehicle charging station includes an amount of the electrical power drawn by the at least one vehicle charging station, and the one or more characteristics of the alternative electrical power generated by the at least one source of alternative electrical energy includes an amount of the alternative electrical power generated by the at least one source of alternative electrical energy, and wherein the balancing is achieved when a cost of an excess of the amount of electrical power drawn by the at least one vehicle charging station over the amount of alternative electrical power generated by the at least one source of alternative electrical energy is less than a predetermined threshold.

12. The system for charging an electric or hybrid-electric vehicle of claim 1, wherein the one or more characteristics of the electrical power drawn by the at least one vehicle charging station includes an amount of the electrical power drawn by the at least one vehicle charging station, and the one or more characteristics of the alternative electrical power generated by the at least one source of alternative electrical energy includes an amount of the alternative electrical power generated by the at least one source of alternative electrical energy, and wherein the balancing is achieved when a carbon footprint of an excess of the amount of electrical power drawn by the at least one vehicle charging station over the amount of alternative electrical power generated by the at least one source of alternative electrical energy is less than a predetermined threshold.

13. The system for charging an electric or hybrid-electric vehicle of claim 1, wherein the at least one source of alternative electrical energy includes a plurality of sources of alternative electrical energy in a neighborhood, and wherein the control server further receives a plurality of readings from the plurality of sources of alternative electrical energy in the neighborhood via the data network, wherein the control server controls a plurality of vehicle charging stations of the at least one vehicle charging stations by issuing a plurality of charge control commands via the data network to charge a plurality of vehicles including the vehicle and one or more other vehicles such as to achieve the balancing of the electrical power drawn by the plurality of vehicle charging stations against the alternative electrical power generated by the plurality of sources of alternative electrical energy in the neighborhood.

14. The system for charging an electric or hybrid-electric vehicle of claim 13, wherein one or more owners of the plurality of sources of alternative electrical energy in the neighborhood that are associated with an excess energy production are compensated using a cryptocurrency.

15. A computer-implemented method for charging an electric or hybrid-electric vehicle, the method comprising:
receiving, by a control server comprising at least one processing unit and a memory and communicatively coupled to at least one vehicle charging station and at least one source of alternative electrical energy via a data network, a reading from the at least one source of alternative electrical energy via the data network, wherein the at least one vehicle charging station is electrically connectable to at least one vehicle and operable to charge the at least one vehicle using an electrical power, wherein the at least one source of alternative electrical energy provides an alternative electrical power, the at least one source of alternative electrical energy being distinct from and an alternative source to a utility power grid, which is to provide the electrical power as a grid electrical power; and
controlling, by the control server, the at least one vehicle charging station by issuing a charge control command via the data network to charge the at least one vehicle such as to achieve balancing of the electrical power drawn by the at least one vehicle charging station against the alternative electrical power generated by the at least one source of alternative electrical energy, wherein the balancing is achieved by comparing one or more characteristics of the electrical power drawn by the at least one vehicle charging station to the alternative electrical power generated by the at least one source of alternative electrical energy.

16. The computer-implemented method for charging an electric or hybrid-electric vehicle of claim 15, wherein a source of the at least one source of alternative electrical energy comprises a photovoltaic panel electrically connected to a photovoltaic inverter and wherein the control server is communicatively coupled to the photovoltaic inverter.

17. The computer-implemented method for charging an electric or hybrid-electric vehicle of claim 16, wherein the reading comprises an amount of sunlight received by the photovoltaic panel.

18. The computer-implemented method for charging an electric or hybrid-electric vehicle of claim 16, wherein the reading comprises an amount of electrical current generated by the photovoltaic panel.

19. The computer-implemented method for charging an electric or hybrid-electric vehicle of claim 16, wherein the reading comprises an amount of an electrical power generated by the photovoltaic panel.

20. A non-transitory computer-readable medium embodying a set of instructions, which, when executed by a control server, cause the control server to:
receive a reading from at least one source of alternative electrical energy via a data network, wherein the control server is communicatively coupled to at least one vehicle charging station, and the at least one vehicle charging station is electrically connectable to at least one vehicle and operable to charge the at least one vehicle using an electrical power, wherein the at least one source of alternative electrical energy provides an alternative electrical power, the at least one source of alternative electrical energy being distinct from and an alternative source to a utility power grid, which is to provide the electrical power as a grid electrical power; and
control the at least one vehicle charging station by issuing a charge control command via the data network to charge the at least one vehicle such as to achieve balancing of the electrical power drawn by the at least one vehicle charging station against the alternative electrical power generated by the at least one source of alternative electrical energy, wherein the balancing is achieved by comparing one or more characteristics of the electrical power drawn by the at least one vehicle charging station to the alternative electrical power generated by the at least one source of alternative electrical energy.

\* \* \* \* \*